United States Patent [19]

Matsuoka et al.

[11] Patent Number: 4,746,299
[45] Date of Patent: May 24, 1988

[54] IC CONNECTOR

[75] Inventors: Noriyuki Matsuoka; Tomio Sasaki, both of Tokyo, Japan

[73] Assignee: Yamaichi Electric Mfg. Co., Ltd., Tokyo, Japan

[21] Appl. No.: 24,788

[22] Filed: Mar. 11, 1987

[30] Foreign Application Priority Data

May 2, 1986 [JP] Japan .............................. 61-67375[U]

[51] Int. Cl.[4] .......................................... H01R 23/72
[52] U.S. Cl. ...................................... 439/70; 439/525
[58] Field of Search ..................... 439/68, 70, 71, 525, 439/526

[56] References Cited

U.S. PATENT DOCUMENTS 4,089,575  5/1978  Grabbe ................................. 439/71
4,222,622  9/1980  Griffin et al. ......................... 439/71
4,679,871  7/1987  Egawa ................................. 439/70

Primary Examiner—Neil Abrams
Attorney, Agent, or Firm—Wenderoth, Lind & Ponack

[57] ABSTRACT

An IC connector for an IC package having a plurality of vertically extending J bend type lead wires arranged in parallel rows along the side surfaces of the IC package main body, each lead wire having a vertical portion and a bent portion at each end thereof extending into the package main body. The connector has a plurality of contacts in spaced opposed parallel rows along the inner sides of the opposite side walls of an accommodating recess in the connector main body, each contact having a first elastic contacting piece extending upwardly and then inwardly and upwardly in the accommodating recess and being resiliently movable toward and away from the corresponding side wall for, when an IC package is inserted into the connector, engaging with a corresponding lead wire at the bent portion which is at the upper end of the vertical portion for exerting an inward and downward force on the lead wire, and a second elastic contacting piece having a first part spaced inwardly in the accommodation recess and being resiliently movable toward and away from the corresponding side wall independently of the first elastic contacting piece for, when an IC package is inserted into the connector, engaging with the same lead wire as the first elastic contacting piece.

3 Claims, 5 Drawing Sheets

F I G. 1
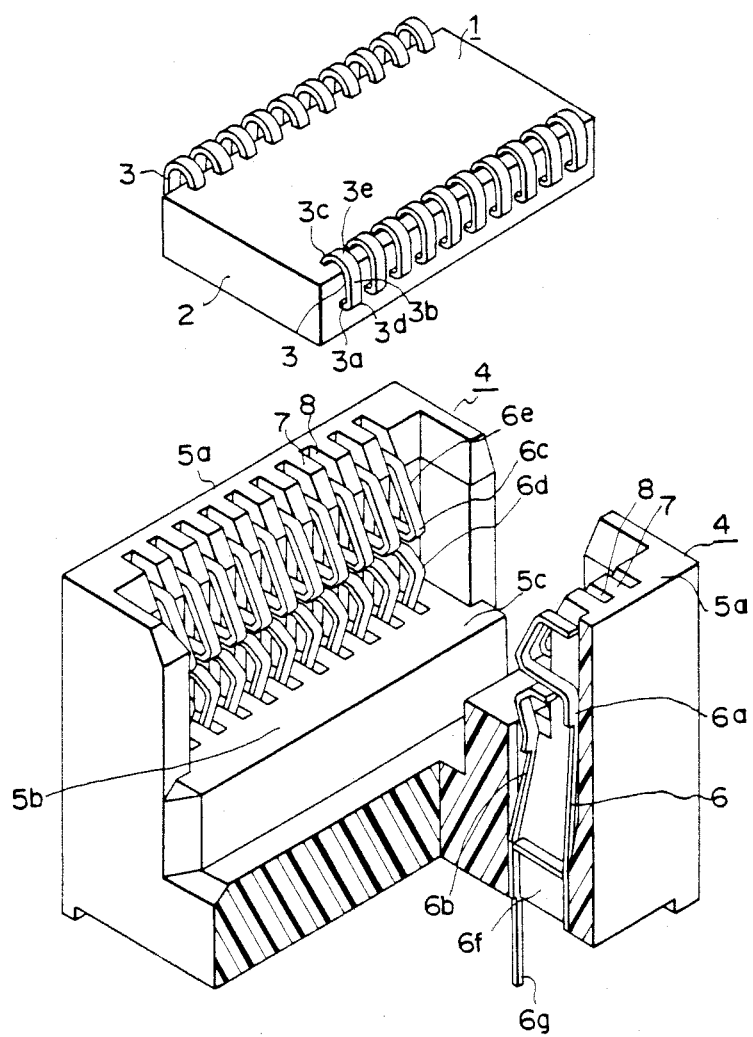

4,746,299

IC CONNECTOR

BACKGROUND OF THE INVENTION

This invention relates to a connector for an IC package having a J bend type lead wire.

The above-mentioned J bend type lead wires are arranged in parallel relation at the side surfaces of the main body of an IC package and the tip of each of the lead wires extending in the vertical direction is bent inwardly in a generally U shape. Since the tip is bent, there cannot be employed a contacting structure in which it is plugged into the connector and held between the contacting pieces of the contact. Because of the foregoing, there is employed a structure in which the contact is urged against the outer surface of a conventional lead wire under elastic pressure to obtain an electric contact engagement and the IC package is held by means of friction contact. However, since it relies upon friction at the side of the lead wire, the insertion is sometimes insufficient, thus frequently resulting in such undesirable effects as that the IC package floats or comes out of the connector due to vibrations and shocks. Thus, the electric contact engagement is ended.

The present invention seeks to eliminate the above-mentioned problems involved in the conventional connector for an IC package having the J bend type lead wire.

SUMMARY OF THE INVENTION

It is therefore the object of the present invention to provide a connector in which a highly reliable electric contact engagement can be obtained between a lead wire and a contact by appropriately designing the outer surface of the contact so that it is suitably brought in contact engagement with the lead wire and while the foregoing contact engagement is maintained, an IC package is properly held between adjacent rows of contacts.

In order to achieve the above object, there is essentially provided an IC connector for an IC package having a J bend type lead wires arranged in parallel relation along the sides of an IC package main body and extending in the vertical direction, and in the connector body a plurality of contacts are arranged in parallel lines opposite to the sides of the IC package main body on the inner sides of the facing side walls of the connector main body forming an accommodating portion for the IC package, and each said contact is provided with a first elastic contacting piece and a second elastic contacting piece, front said first elastic contacting piece being engaged with an outer surface of one bent portion of said J bend type lead wire under pressure at an upper part of the lead wire to exert a push-down force, and said second elastic contacting piece being engaged with an outer surface of the outer bent portion of said J bend type lead wire under pressure at a lower part of the lead wire.

BRIEF DESCRIPTION OF THE DRAWINGS

Other objects and advantages of the present invention will become apparent from the detailed description of the present invention to follow, when taken in conjunction with the accompanying drawings in which:

FIG. 1 is a perspective view, partly cut away, of a connector and an IC package according to one embodiment of the present invention;

DETAILED DESCRIPTION OF THE EMBODIMENT

Figure 2:
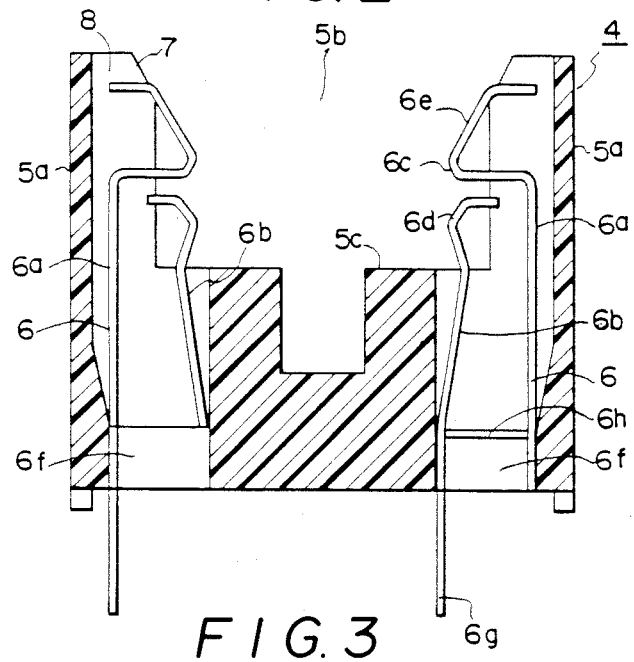
FIG. 2 is a sectional view of the connector.

One preferred embodiment of the present invention will be described hereinafter in greater detail with reference to FIGS. 1 through 10.

An IC package 1 has a main body 2 comprising a square insulating plate with an IC built therein. The IC package includes a plurality of lead wires 3 arranged in parallel relation on the side surfaces of the main body 2 and extending in the vertical direction. Each lead wire 3 includes a base portion piece 3a slightly projecting sidewardly from the side surface of the IC package main body 2, a side portion piece 3b extending in the vertical direction along the side surface of the main body 2 from the base portion piece 3a and an upwardly bent portion 3d, and a tip portion piece 3c bent inwardly from the side portion piece 3b and downwardly bent portion 3e in a generally U shape.

FIG. 1 shows an IC package 1 in its reversed state in order to insert it into a connector reversely. A connector 4 is provided for the IC package 1 and which has a connector main body 5 made of a suitable insulating material. The connector main body 5 includes opposite side walls 5a spaced from to each other. An IC accommodating portion 5b is defined by the side walls 5a. The IC package 1 is accommodated in the IC accommodating portion 5b and the lead wires 3 arranged on the side surfaces are placed opposite the inner sides of the side walls 5a. Vertical partition walls 7 are provided on the inner sides of the side walls 5a in parallel relation at equal spaces along the inner side of each of the side walls 5a. A contact accommodating groove 8 is formed between the adjacent partition walls 7. A contact 6 adapted to contact a lead wire 3 is accommodated in each of the contact accommodating grooves 8. The contacts 6 are partitioned and separated from each other by the partition walls 7.

The contact 6 is provided with a first elastic contacting piece 6a and a second elastic contacting piece 6b. Both of the first and second elastic contacting pieces 6a and 6b extend upwardly, with the second elastic contacting piece 6b arranged at a front location and the first elastic contacting piece 6a arranged behind the second elastic contacting piece 6b. The first elastic contacting piece 6a is formed at its free end with an upper part pressure contacting portion 6c which is curved forwardly, while the second elastic contacting piece 6a is formed at its free end with a lower part pressure contacting portion 6d which is also curved forwardly.

The upper part pressure contacting portion 6c is provided right above the lower part pressure contacting portion 6d exceeding the tip of the latter. The upper part pressure contacting portion 6c is provided at its end portion with a guiding piece 6e at predetermined elevation angle.

Figure 7:
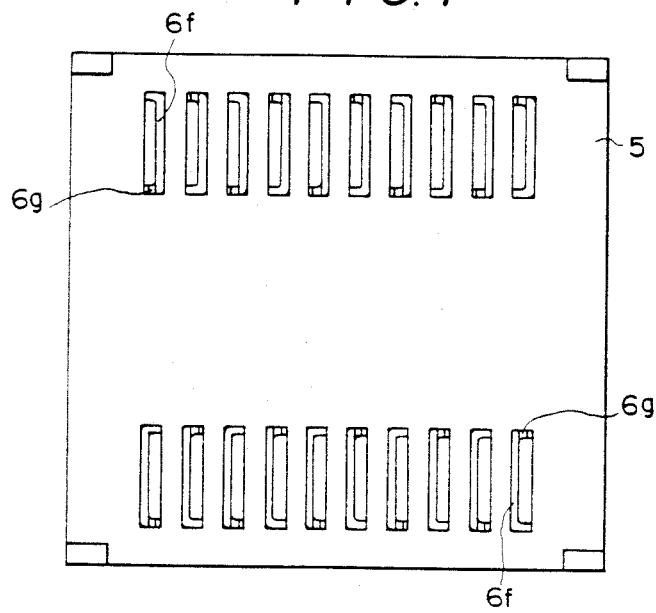
FIG. 7 is a bottom view of the connector.
Figure 8:
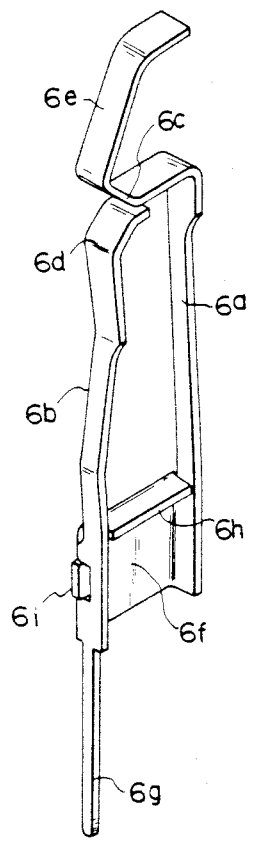
FIG. 8 is a perspective view of a contact when viewed from the back.
Figure 9:
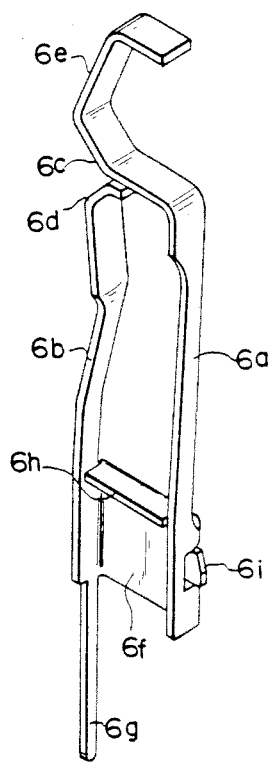
FIG. 9 is a perspective view of the contact when viewed from the front.

Both of the first and second elastic contacting pieces 6a and 6b are made of the same base material and the lower ends are connected to a connecting plate portion 6f. The connecting plate portion 6f acts as a mounting portion with respect to the connector main body 5. A male terminal 6g projects downwardly from the connector main body 5 from the connecting plate portion 6f. As shown in FIGS. 8 and 9, the connecting plate portion 6f is formed in a generally C shape. As shown in FIG. 7, the connecting plate portion 6f is positioned with the generally C-shaped end faces facing upwardly and downwardly. The first elastic contacting piece 6a extends upwardly from an upper end of one edge portion bent over from plate portion 6f, while the second elastic contacting piece 6b extends upwardly from an upper end of an edge bent over from the opposite edge of plate portion 6f. The upper edge portion of connecting plate portion 6f is curved inwardly between the first and second elastic contacting pieces 6a and 6b to form an intermediate piece 6h. Both end faces of the intermediate pieces 6h and the inner surfaces of the first and second elastic contacting pieces 6a and 6b are held in an adjacent state or abutting state with respect to each other. The generally C-shaped connecting plate portion 6f is provided with a pressure insertion claw 6i projecting from its side edge. The generally C-shaped connecting plate portion 6f is generally fitted tightly into a mounting hole in the bottom of main body 5 and the pressure insertion claw 6i wedges against the inner surface of the hole for fixing the contact 6 therein. At this time, both the end edges of the intermediate piece 6h are abutted against the inner surfaces of the base portions of the first and second elastic contacting pieces 6a and 6b to support them.

Figure 3:
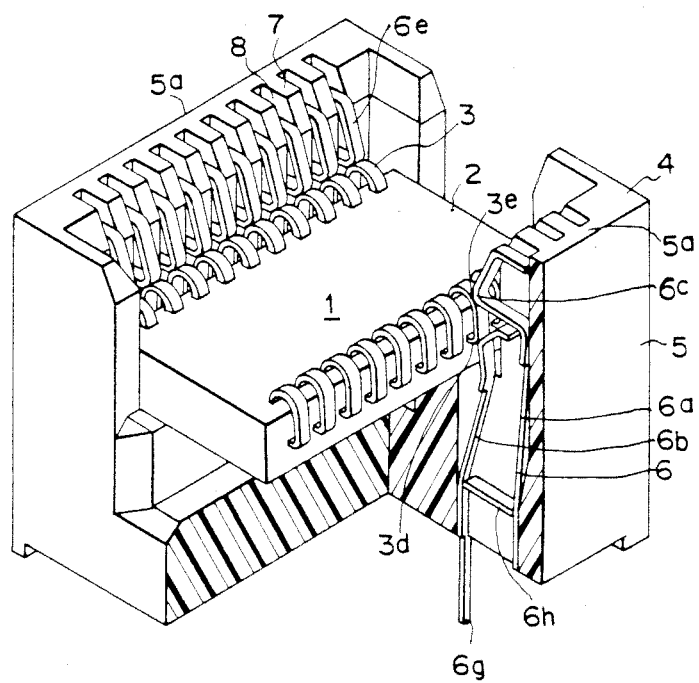
FIG. 3 is a perspective view, partly cut away, of the connector in which an IC package is reversely inserted.
Figure 4:
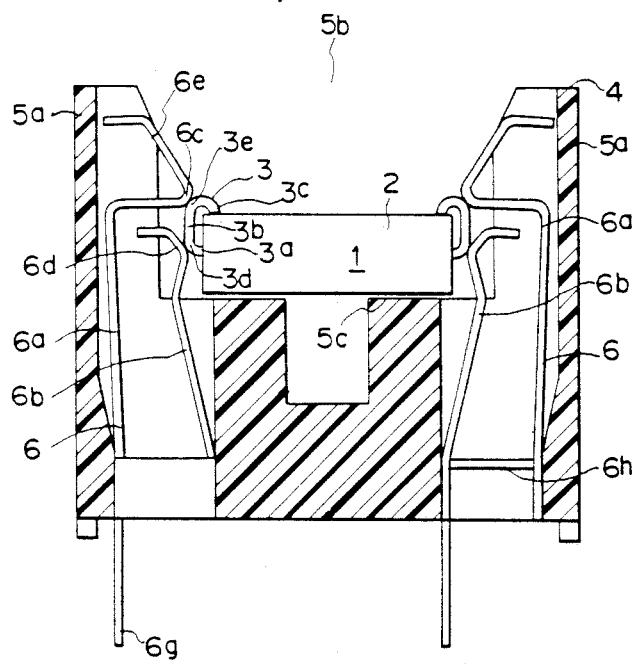
FIG. 4 is a sectional view of the same.

The IC package 1 is inserted upside down into the IC accommodating portion 5b which is formed as shown in FIGS. 3 and 4 and pushed into the space between the opposite rows of the contacts 6 arranged in parallel relation on the inner surfaces of the facing side walls 5a.

The first and second elastic contacting pieces 6a and 6b are elastically displaceable toward and away from the side surface of the IC package main body 2. When the IC package 1 is accommodated with the IC accommodating portion 5b of the body 5, the upper part pressure contacting portion 6c of the first elastic contacting piece 6a is elastically engaged with the downwardly bent portion 3e of the J bend type lead wire 3 with the upper part pressure contacting portion 6c placed thereupon, while the lower part pressure contacting portion 6d of the second elastic contacting piece 6b is elastically engaged with the upwardly bent portion 3d of the lead wire 3 with the lower part pressure contacting portion 6d placed thereunder.

Figure 5:
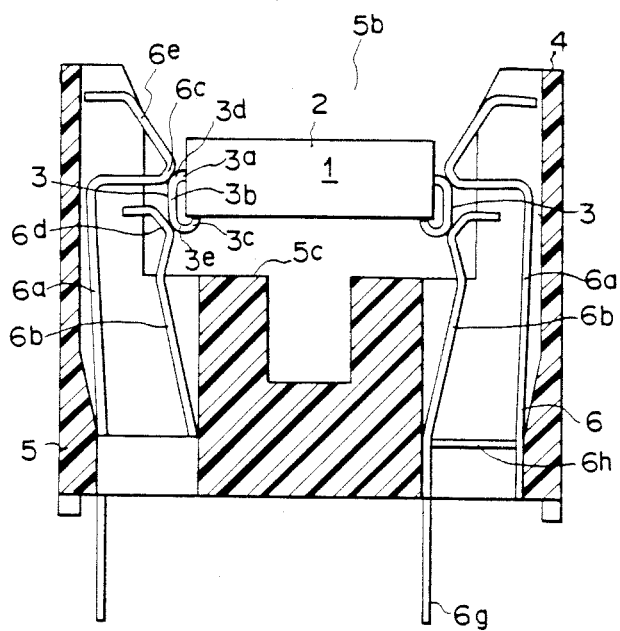
FIG. 5 is a sectional view of a connector in which the IC package is normally inserted.

As shown in FIG. 5, the IC package is in its normal position and pushed into the space between the adjacent rows of the contacts. The upper part pressure contacting portion 6c of the first elastic contacting piece 6a is elastically engaged with the upwardly bent portion 3d of the J bend type lead wire 3 under pressure, whereas the lower part pressure contacting portion 6d of the second elastic contacting piece 6d is elastically engaged with the downwardly bent portion 3e of the lead wire 3 under pressure.

In the respective reverse insertion and normal insertion, the first elastic contacting piece 6a is contact engaged with the outer surface of the downwardly bent portion 3e or the upwardly bent portion 3d of the lead wire 3 under pressure by means of elastic force applied inwardly and applies to the lead wire 3 a downward force to produce a downward component of force thereby to always urge the IC package main body 2 in the pushing-in direction to thereby prevent the IC package 1 from separating from the body 5 and to obtain a good electric contact pressure.

At the same time, the second elastic contacting piece 6b is engaged with the outer surface of the upwardly bent portion 3d or the downwardly bent portion 3e of the lead wire 3 by means of the elastic restoring force applied inwardly. By obtaining a proper contacting pressure by the first and second elastic contacting pieces 6a and 6b, the IC package main body 2 is held within the IC accommodating portion 5b.

In the above-described embodiment shown in FIGS. 3 through 5, the pressure contacting portion 6d of the second elastic contacting piece 6b applies a pushing-up force to the lead wire 3, and the pressure contacting portions 6c and 6d of the first and second elastic contacting piece 6a and 6b together hold the lead wire 3, thereby to hold the IC package main body 2 in a floating state spaced from the bottom surface 5c of the accommodating portion 5b.

Figure 6:
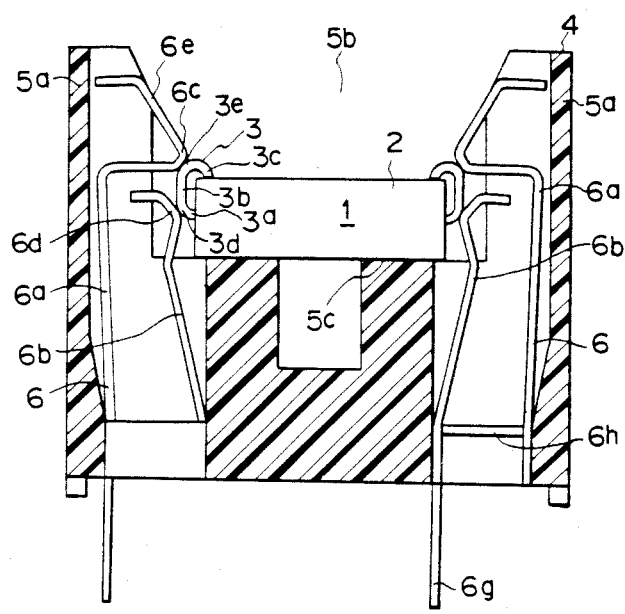
FIG. 6 is a sectional view of a connector showing another example of IC package insertion.

In the above-described embodiment shown in FIG. 6, the IC package 1 is inserted upside down and the IC package main body 2 is held on the bottom surface of the IC accommodating portion 5b by means of the pushing-down force of the pressure contacting portion 6c of the first elastic contacting piece 6a.

Figure 10:
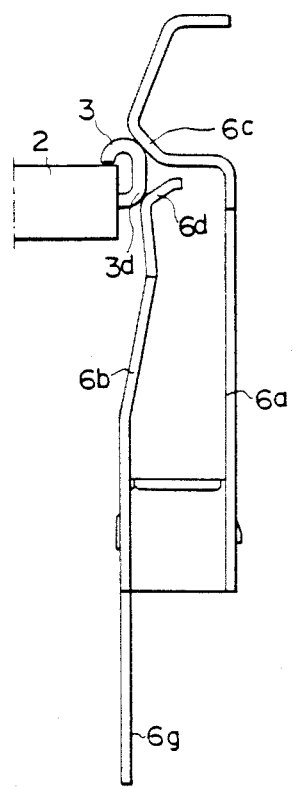
FIG. 10 is a side view of a contact according to another embodiment of the present invention.

In another preferred embodiment of the contact 6, the upper part pressure contacting portion 6c of the first elastic contacting piece 6a, as shown in FIG. 10, is provided at predetermined depression angles to provide a favorable pushing-down force to one or the other of the bent portions 3e or 3d, whereas the lower part pressure contacting portion 6d of the second elastic contacting piece 6b is provided at a predetermined elevation angle to provide a relative pushing-up force to the other bent portion 3d or 3e of the lead wire 3.

According to the present invention, in a connector for an IC package having a J bend type lead wires, by contact pressure of a first elastic contacting piece of a contact which is engaged with one bent portion of the upper part of a lead wire under pressure, and contact pressure of a second elastic contacting piece of a contact which is engaged with the other bent portion of the lower part of a lead wire under pressure, a highly reliable electric contact can be obtained. In addition, the IC package is prevented from floating upwardly from the body containing the contacts by the pushing-down force of the lead wire due to the contact pressure of the first elastic contacting piece and is surely held within an accommodating portion of the body. Thus, the play and separation of the IC package caused by vibrations, shocks, etc. can be effectively prevented, and the contact stage can be properly maintained by the first and second elastic contacting pieces.

According to the present invention, a favorable contact engagement as well as the holding of the IC package can be obtained by making use of the form of the J bend type lead wire engaged by the first and second elastic contacting pieces, so that the disadvantage of the conventional lead wire outer contacting type connector can be eliminated by the contact of this invention.

While it will be apparent that the preferred embodiment of the present invention herein disclosed is well calculated to fulfill the object above state, it will be appreciated that the present invention is susceptible to modification, variation and change without departing from the proper scope or fair meaning of the subjoined claims.

What is claimed is:

1. An IC connector for an IC package having a plurality of vertically extending J bend type lead wires arranged in parallel rows along the side surfaces of the IC package main body, each lead wire having a vertical portion and a bent portion at each end thereof extending into the package main body, said connector comprising:
    a main body having a package accommodating recess therein defined by opposite side walls; and
    a plurality of contacts in spaced opposed parallel rows along the inner sides of the opposite side walls, each contact having a first elastic contacting piece extending upwardly and then inwardly and unwardly in said accommodating recess and being resiliently movable toward and away from the corresponding side wall for, when an IC package is inserted into said connector, engaging with a corresponding lead wire at the bent portion which is at the upper end of the vertical portion for exerting an inward and downward force on the lead wire, and a second elastic contacting piece having a first part spaced inwardly in said accommodation recess from the upwardly extending part of said first elastic contacting piece, and having a further part extending from the upper end of said first part in an outward direction and being resiliently movable toward and away from the corresponding side wall independently of said first elastic contacting piece for, when an IC package is inserted into said connector, engaging with the same lead wire as said first elastic contacting piece and at the bent portion which is at the lower end of the vertical portion for exerting a contacting force thereon.

2. An IC connector as claimed in claim 1 in which said first elastic contacting piece is positioned for urging the IC package against the bottom of said main body.

3. An IC connector as claimed in claim 1 in which said further part of said second elastic contacting piece also extends upwardly for exerting an upward force on the lead wire of the IC package, whereby the IC package is held firmly between the first and second elastic contacting pieces.

* * * * *